(12) United States Patent
Lu

(10) Patent No.: US 12,309,978 B1
(45) Date of Patent: May 20, 2025

(54) FAN BOX FAN PARTITION PLATE, FAN BOX MODULE AND SERVER

(71) Applicant: SUZHOU METABRAIN INTELLIGENT TECHNOLOGY CO., LTD., Jiangsu (CN)

(72) Inventor: Yusong Lu, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/878,025

(22) PCT Filed: Dec. 26, 2023

(86) PCT No.: PCT/CN2023/142084
§ 371 (c)(1),
(2) Date: Dec. 21, 2024

(87) PCT Pub. No.: WO2024/152856
PCT Pub. Date: Jul. 25, 2024

(30) Foreign Application Priority Data

Jan. 19, 2023 (CN) .......................... 202310071679.2

(51) Int. Cl.
H05K 7/20 (2006.01)
F04D 29/60 (2006.01)

(52) U.S. Cl.
CPC ....... H05K 7/20736 (2013.01); F04D 29/603 (2013.01)

(58) Field of Classification Search
CPC .......................... H05K 7/20736; F04D 29/603
See application file for complete search history.

(56) References Cited

U.S. PATENT DOCUMENTS

2004/0181367 A1 9/2004 Nguyen et al.
2014/0118937 A1 5/2014 Adrian et al.

FOREIGN PATENT DOCUMENTS

| CN | 2891608 Y | 4/2007 |
|----|-----------|--------|
| CN | 204129640 U | 1/2015 |
| CN | 208314681 U | 1/2019 |
| CN | 210129188 U | 3/2020 |
| CN | 210691216 U | 6/2020 |
| CN | 111857259 A | 10/2020 |
| CN | 111966170 A | 11/2020 |
| CN | 114658688 A | 6/2022 |
| CN | 115793802 A | 3/2023 |

Primary Examiner — Brian O Peters
(74) Attorney, Agent, or Firm — IPro, PLLC

(57) ABSTRACT

An air-blower-container fan partition-plate includes a handle assembly and a main partition-plate body. The main partition-plate body includes a housing, and the housing has a containing cavity, and includes a mounting plate and a locking plate that enclose to form the cavity wall of the containing cavity. The handle assembly includes a main handle body and a locking assembly connected to each other, the locking assembly is located in the containing cavity, the locking assembly faces an avoiding hole provided in the locking plate, and the main handle body is mounted to the mounting plate. When the handle assembly is in a first state, part of the locking assembly protrudes out of the avoiding hole, and protrudes out of the mounting plate. When the handle assembly is in a second state, part of the locking assembly retracts inside the avoiding hole, and is flush with the mounting plate.

20 Claims, 11 Drawing Sheets

FAN BOX FAN PARTITION PLATE, FAN BOX MODULE AND SERVER

CROSS-REFERENCE TO RELATED APPLICATION

The present application claims the priority of the Chinese patent application filed on Jan. 19, 2023 before the Chinese Patent Office with the application number of 202310071679.2 and the title of "FAN BOX FAN PARTITION PLATE, FAN BOX MODULE AND SERVER", which is incorporated herein in its entirety by reference.

FIELD

The present application relates to the technical field of air-blower containers, and particularly relates to an air-blower-container fan partition-plate, an air-blower-container module and a server.

BACKGROUND

With the development of science and technology, servers are being applied increasingly more extensively. Usually, a server comprises a crate body, an air-blower-container module is provided in the crate body, and a fan module is installed in the air-blower-container module, whereby heat dissipation may be performed to the server. Moreover, the air-blower-container module comprises a container body and an air-blower-container fan partition-plate, and the air-blower-container fan partition-plate is installed in the container body.

SUMMARY

An object of the embodiments of the present application is to provide an air-blower-container fan partition-plate, an air-blower-container module and a server.

In the first aspect, an embodiment of the present application provides an air-blower-container fan partition-plate, wherein the air-blower-container fan partition-plate comprises a handle assembly and a main partition-plate body;
 the main partition-plate body comprises a housing, the housing has a containing cavity, the housing comprises a mounting plate and a locking plate, and both of the mounting plate and the locking plate are plates that enclose to form a cavity wall of the containing cavity;
 the handle assembly comprises a main handle body and a locking assembly, the main handle body is connected to the locking assembly, the locking assembly is located in the containing cavity, an avoiding hole is provided in the locking plate, a position of the locking assembly faces a position of the avoiding hole, and the main handle body is mounted to the mounting plate;
 in respond to the handle assembly being in a first state, part of the locking assembly protrudes out of the avoiding hole, and protrudes out of the mounting plate; and
 in respond to the handle assembly being in a second state, part of the locking assembly retracts inside the avoiding hole, and is flush with the mounting plate.

In some embodiments, the locking assembly comprises a locking housing and a stretching assembly;
 the locking housing is located in the containing cavity, the locking housing is connected to the main handle body, part of the stretching assembly is located in the locking housing, a position of the stretching assembly faces the position of the avoiding hole, and the stretching assembly is stretchable;
 in respond to the handle assembly being in the first state, part of the stretching assembly protrudes out of the avoiding hole, and protrudes out of the mounting plate; and
 in respond to the handle assembly being in the second state, part of the stretching assembly retracts inside the avoiding hole, and is flush with the mounting plate.

In some embodiments, the stretching assembly comprises an elastic member and a bolt; and
 the bolt comprises a fixing part and a locking part, the fixing part is connected to the locking part, the fixing part is located in the locking housing, the fixing part is connected to the locking housing, the locking part is located outside the locking housing, the elastic member is located in the locking housing, a first end of the elastic member abuts the fixing part, and a second end of the elastic member abuts the locking housing.

In some embodiments, the fixing part comprises a fixing column and a boss provided on the fixing column, the boss surrounds an outer wall of the fixing column, and one end of the fixing column is connected to the locking part.

In some embodiments, the elastic member is a spring, the spring is nested to the fixing column, and a first end of the spring abuts a surface of the boss that is opposite to the locking part.

In some embodiments, the locking housing comprises an upper housing and a lower housing; and
 the upper housing abuts the lower housing, the lower housing is connected to the main handle body, the upper housing is of a tubular structure, an inner wall of the upper housing has a blocking boss, the lower housing has a containing space, the fixing part penetrates the upper housing, and part of the fixing part is located in the containing space and connected to the lower housing.

In some embodiments, the locking part has an oblique face.

In some embodiments, a first mounting hole and a second mounting hole are provided in the mounting plate, a first end of the main handle body penetrates the first mounting hole, and the locking housing is connected to the first end of the main handle body; and
 a second end of the main handle body is connected to a fastening column, the fastening column penetrates the second mounting hole, and the fastening column is fixed by a fastener.

In some embodiments, both of the first mounting hole and the second mounting hole are oblong holes, and a direction of extension of the oblong holes is the same as a direction of stretching of the stretching assembly.

In some embodiments, the main handle body is provided with a first blocking part and a second blocking part, the first blocking part is located at the first end of the main handle body, the second blocking part is located at the second end of the main handle body, both of the first blocking part and the second blocking part are located outside the containing cavity, the first blocking part blocks a space of the first mounting hole that is not occupied by the first end of the main handle body, and the second blocking part blocks a space of the second mounting hole that is not occupied by the fastening column.

In some embodiments, in a direction of contraction of the stretching assembly, a distance between the first end of the main handle body and a hole wall of the first mounting hole is equal to a distance between the fastening column and a hole wall of the second mounting hole, and the distance between the first end of the main handle body and the hole wall of the first mounting hole is greater than or equal to a protrusion length by which the stretching assembly protrudes out of the mounting plate, wherein the protrusion length refers to, when the stretching assembly protrudes out of the mounting plate, a distance between one end of the stretching assembly that protrudes out of the mounting plate and the mounting plate.

In some embodiments, a length of the fastening column is greater than a thickness of the mounting plate, wherein the length of the fastening column refers to a distance between two opposite ends of the fastening column.

In some embodiments, a difference between the length of the fastening column and the thickness of the mounting plate is within a preset difference range, wherein the preset difference range is 1.5 millimeters to 2.5 millimeters.

In some embodiments, a threaded hole is provided in the fastening column in an axial direction of the fastening column, the fastener is a screw, the screw is provided in the threaded hole, and a nut of the screw and the second end of the main handle body are located on two sides of the mounting plate.

In some embodiments, a first through hole is provided in the locking housing, a second through hole is provided in the main handle body, and a riveting pin penetrates the first through hole and the second through hole, to cause the locking housing to be connected to the main handle body.

In some embodiments, a mounting through hole is provided in the housing, and a position of the mounting through hole faces a position of the first through hole.

In some embodiments, the air-blower-container fan partition-plate further comprises a blocking member, the blocking member is located in the mounting through hole, the blocking member blocks the mounting through hole, and the blocking member is flush with the housing.

In some embodiments, the housing comprises a spring moving plate and a plurality of connecting plates, the plurality of connecting plates, the mounting plate, the locking plate and the spring moving plate enclose to form the containing cavity, the spring moving plate is movably connected to one instance of the connecting plates, the spring moving plate is movable relative to the connecting plate, and the spring moving plate is switchable between a deployment state and a contraction state.

In the second aspect, an embodiment of the present application provides an air-blower-container module, wherein the air-blower-container module comprises a container body and the air-blower-container fan partition-plate according to any one of the embodiments in the first aspect;
the container body has an installation cavity, the air-blower-container fan partition-plate is installed in the installation cavity, a cavity wall of the installation cavity has a locking hole, and a position of the locking hole faces the position of the avoiding hole;
in respond to the handle assembly being in the first state, part of the locking assembly protrudes out of the locking hole, and protrudes out of an outer surface of the container body; and
in respond to the handle assembly being in the second state, part of the locking assembly retracts inside the locking hole, and is flush with the mounting plate.

In some embodiments, a quantity of the air-blower-container fan partition-plate is two, and the air-blower-container module further comprises a plurality of blocking plates; and
the two air-blower-container fan partition-plates are separately arranged, all of the plurality of blocking plates are separately arranged between the two air-blower-container fan partition-plates, gaps between the air-blower-container fan partition-plates and the blocking plates are for containing fan modules, gaps between the air-blower-container fan partition-plates and inner walls of the container body are for containing fan modules, and gaps between the blocking plates are for containing fan modules.

In some embodiments, the air-blower-container module further comprises the fan modules; and
the fan modules are provided in the gaps between the air-blower-container fan partition-plates and the blocking plates, and/or the gaps between the air-blower-container fan partition-plates and the inner walls of the container body, and/or the gaps between the blocking plates.

In the third aspect, an embodiment of the present application provides a server, wherein the server comprises a crate body and the air-blower-container module according to any one of the embodiments in the second aspect; and
an installation slot is provided on a crate wall of the crate body, the air-blower-container module is installed in the crate body, and the locking assembly that protrudes out of the outer surface of the container body is located in the installation slot.

In the embodiments of the present application, because the housing of the main partition-plate body has the containing cavity, and both of the mounting plate and the locking plate of the housing are plates that enclose to form the cavity wall of the containing cavity, the handle assembly and the main partition-plate body may be connected; in other words, the main handle body of the handle assembly may be mounted to the mounting plate. Because the main handle body is connected to the locking assembly, the locking assembly is located in the containing cavity, the avoiding hole is provided in the locking plate, and the position of the locking assembly faces the position of the avoiding hole, when the handle assembly is in different states, the locking assembly may protrude out of the avoiding hole or retract inside the avoiding hole. Particularly, when the handle assembly is in the first state, part of the locking assembly protrudes out of the avoiding hole, and protrudes out of the mounting plate. When the handle assembly is in the second state, part of the locking assembly retracts inside the avoiding hole, and is flush with the mounting plate. In other words, in the embodiments of the present application, by providing the main handle body and the locking assembly, and by providing the avoiding hole in the locking plate, part of the locking assembly may protrude out of the avoiding hole, or the locking assembly may retract inside the avoiding hole. Therefore, when the air-blower-container fan partition-plate according to the embodiments of the present application is applied in the air-blower-container module, and the air-blower-container module is installed in the server, the air-blower-container module may be locked in the server by using the locking assembly; in other words, by configuring that part of the locking assembly protrudes out of the avoiding hole, the part of the locking assembly locks the air-blower-container module in the server. When it is required to detach the air-blower-container module, the locking assembly may be caused to retract inside the avoiding hole, thereby detaching the air-blower-container module from the server. In other words, by providing the main handle body and the locking assembly, that may facilitate the user to hold the main handle body so as to install the air-blower-container module into the server, and the locking assembly may lock the air-blower-container module in the server, so as to facilitate the installation of the air-blower-container module in the server.

REFERENCE NUMBERS

Figure 1:
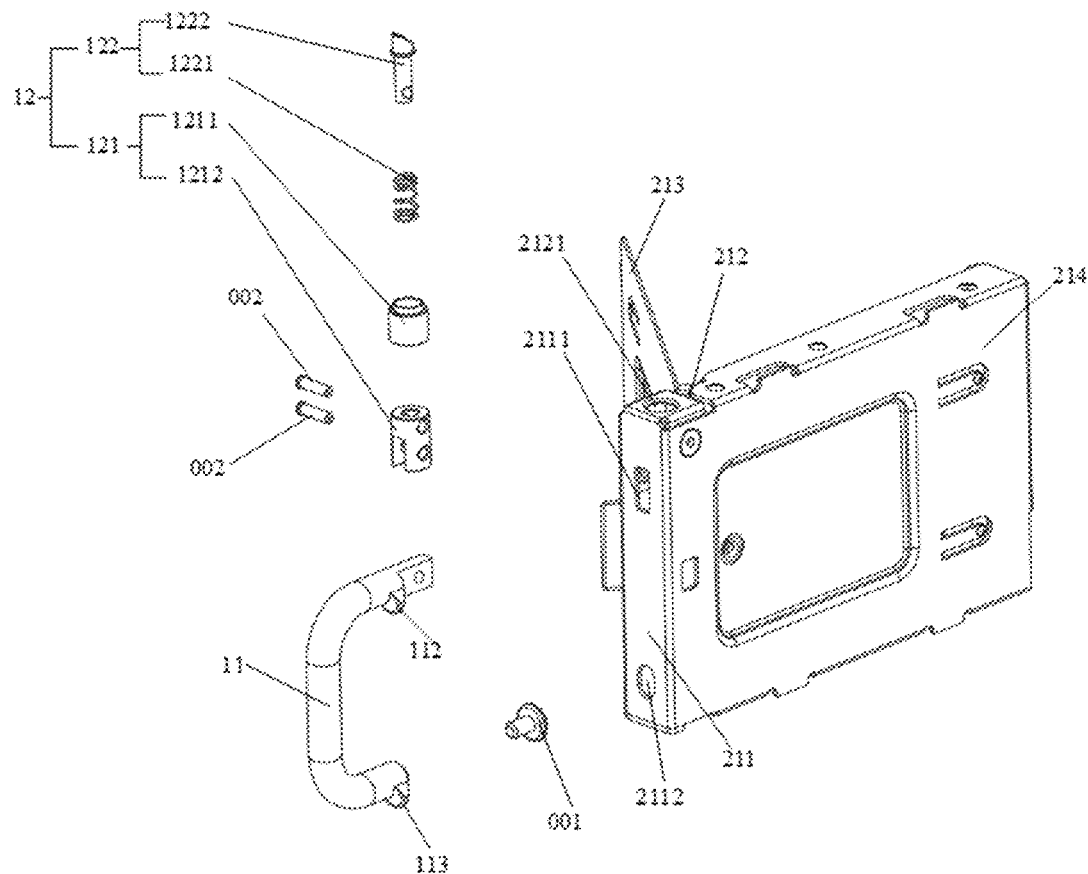
FIG. 1 shows an exploded view of an air-blower-container fan partition-plate according to an embodiment of the present application.
Figure 2:
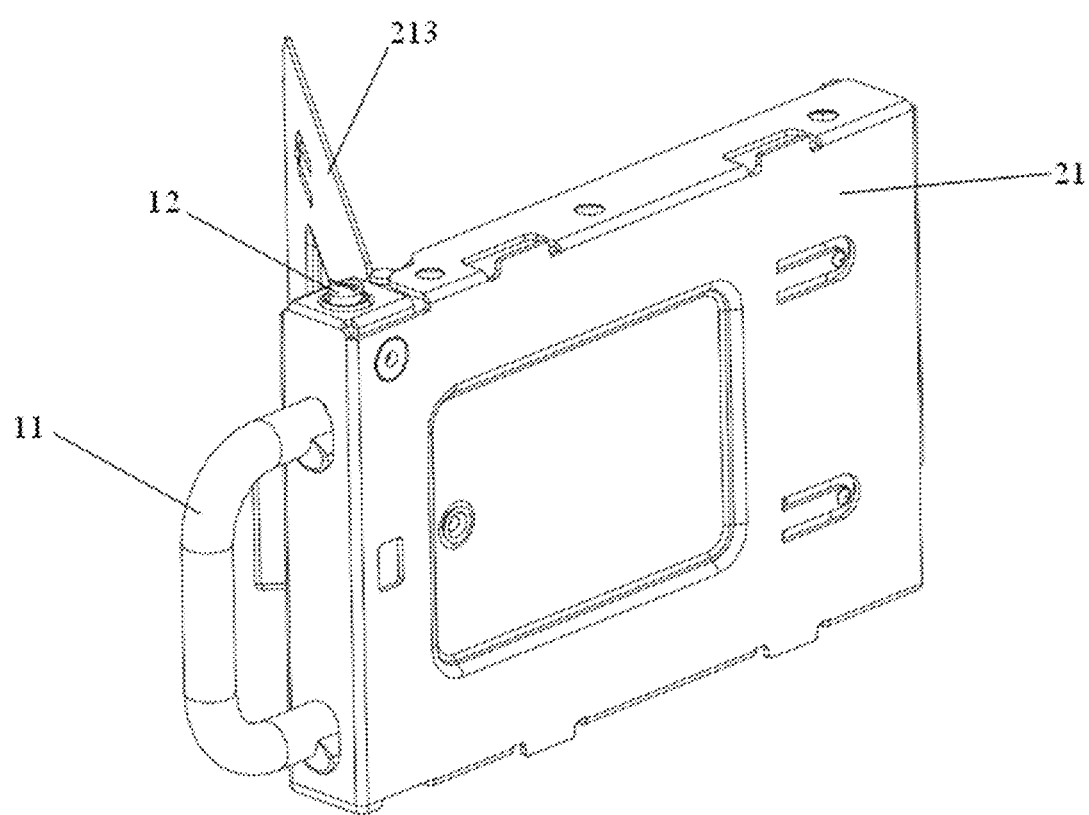
FIG. 2 shows a first schematic diagram of an air-blower-container fan partition-plate according to an embodiment of the present application.
Figure 3:
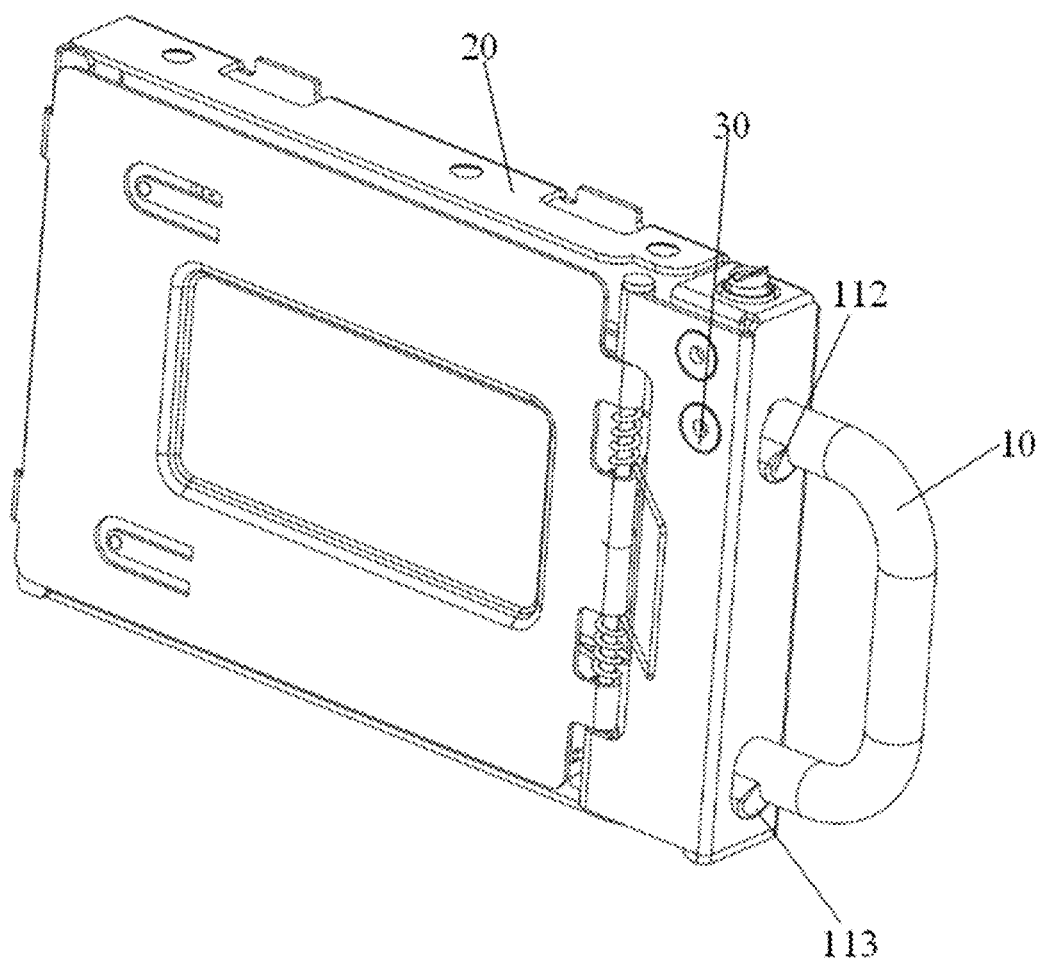
FIG. 3 shows a second schematic diagram of an air-blower-container fan partition-plate according to an embodiment of the present application.
Figure 4:
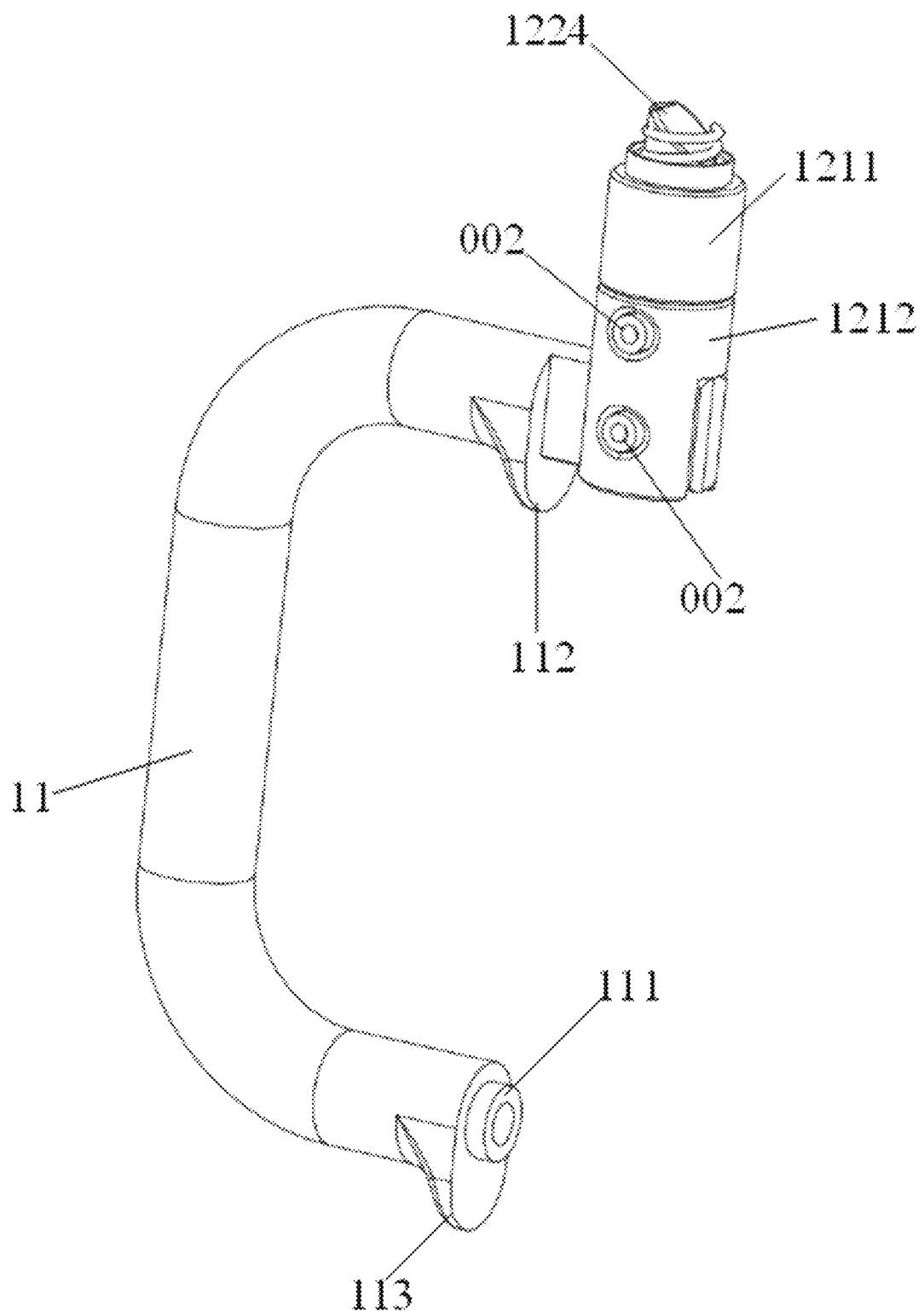
FIG. 4 shows a schematic diagram of a handle assembly according to an embodiment of the present application.
Figure 5:
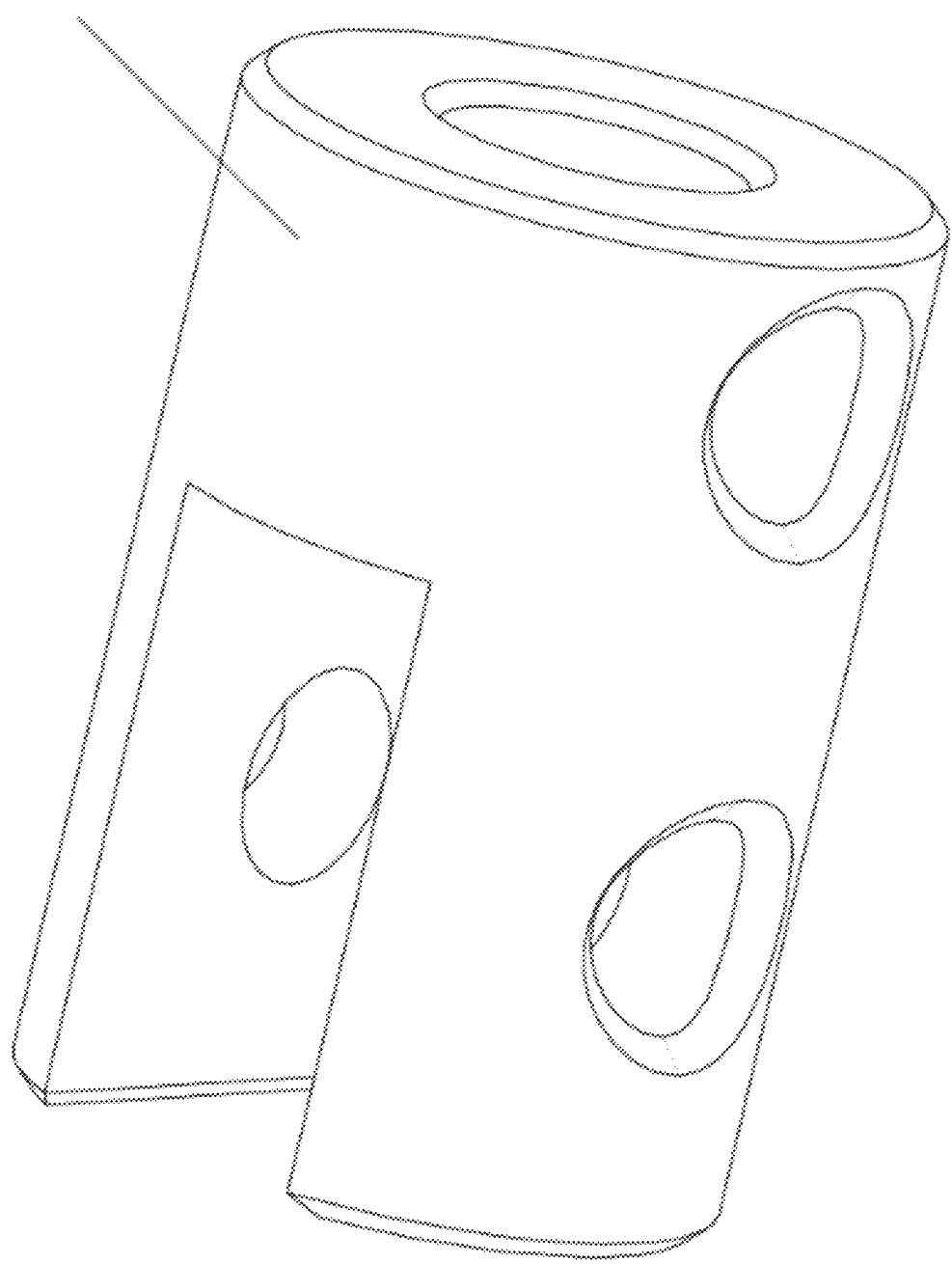
FIG. 5 shows a schematic diagram of a lower housing according to an embodiment of the present application.
Figure 6:
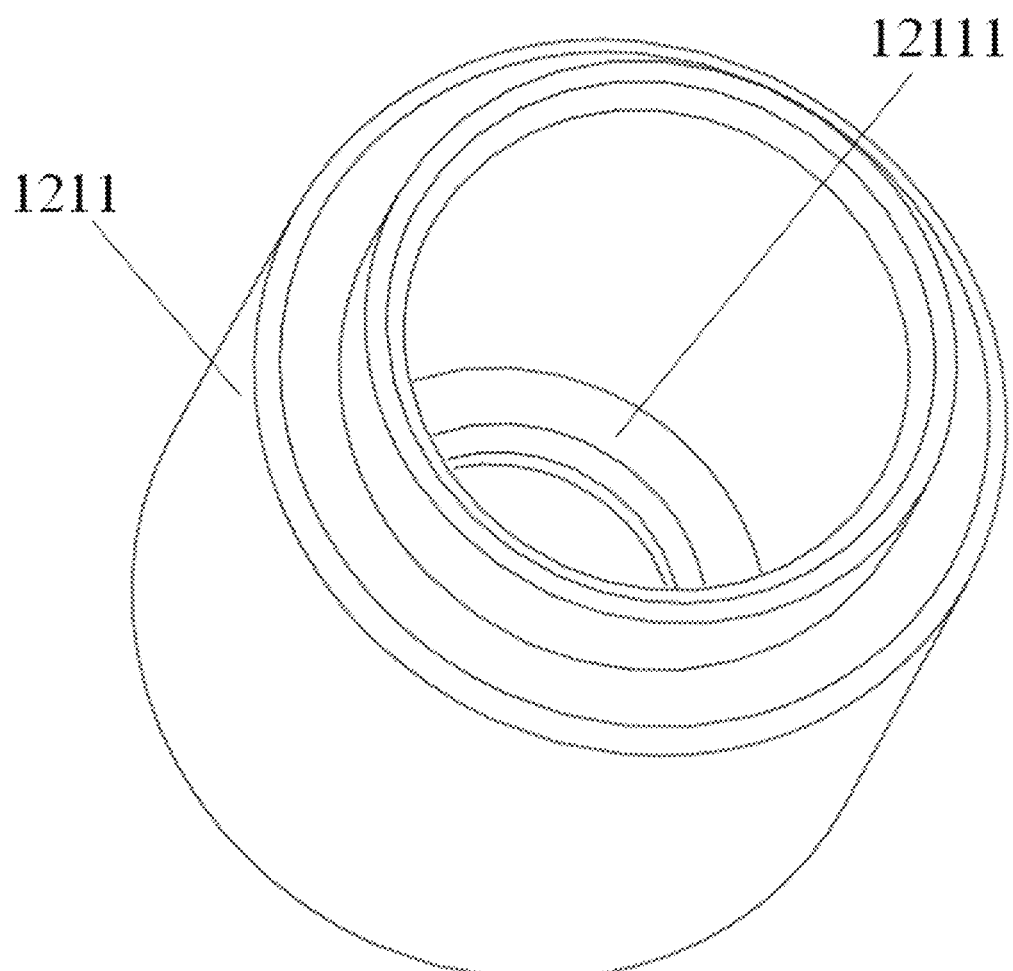
FIG. 6 shows a schematic diagram of an upper housing according to an embodiment of the present application.
Figure 7:
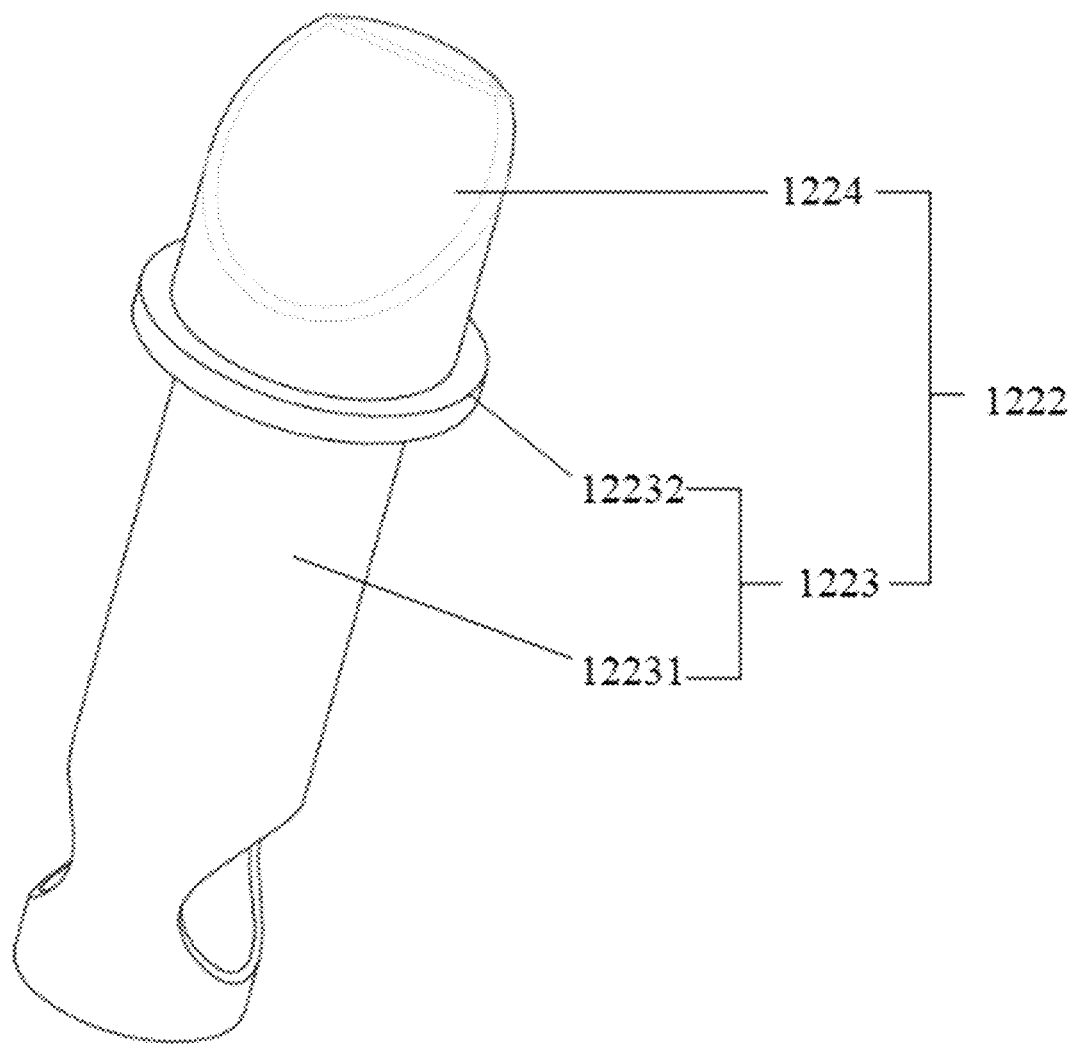
FIG. 7 shows a schematic diagram of a bolt according to an embodiment of the present application.

001: fastener; 002: riveting pin; 10: handle assembly; 30: blocking member; 11: main handle body; 12: locking assembly; 111: fastening column; 112: first blocking part; 113: second blocking part; 121: locking housing; 122: stretching assembly; 1211: upper housing; 1212: lower housing; 12111: blocking boss; 1221: elastic piece; 1222: bolt; 1223: fixing part; 1224: locking part; 12231: fixing column; 12232: boss; 20: main partition-plate body; 21: housing; 211: mounting plate; 212: locking plate; 2121: avoiding hole; 213: spring moving plate; 214: connecting plates; 2111: first mounting hole; 2112: second mounting hole; 100: container body; 101: installation cavity; 102: blocking plates; 200: fan modules; and 300: refrigerator body.

DETAILED DESCRIPTION

The technical solutions according to the embodiments of the present application will be clearly and completely described below with reference to the drawings according to the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

It should be understood that the "one embodiment" or "an embodiment" as used throughout the description means that particular features, structures or characteristics with respect to the embodiments are included in at least one embodiment of the present application. Therefore, the "in one embodiment" or "in an embodiment" as used throughout the description does not necessarily refer to the same embodiment. Furthermore, those particular features, structures or characteristics may be combined in one or more embodiments in any suitable form.

As shown in FIGS. 1 to 7, the air-blower-container fan partition-plate comprises a handle assembly 10 and a main partition-plate body 20.

The main partition-plate body 20 comprises a housing 21, the housing 21 has a containing cavity, the housing 21 comprises a mounting plate 211 and a locking plate 212, and both of the mounting plate 211 and the locking plate 212 are plates that enclose to form the cavity wall of the containing cavity. The handle assembly 10 comprises a main handle body 11 and a locking assembly 12, the main handle body 11 is connected to the locking assembly 12, the locking assembly 12 is located in the containing cavity, an avoiding hole 2121 is provided in the locking plate 212, the position of the locking assembly 12 faces the position of the avoiding hole 2121, and the main handle body 11 is mounted to the mounting plate 211. When the handle assembly 10 is in a first state, part of the locking assembly 12 protrudes out of the avoiding hole 2121, and protrudes out of the mounting plate 211. When the handle assembly 10 is in a second state, part of the locking assembly 12 retracts inside the avoiding hole 2121, and is flush with the mounting plate 211.

In the embodiments of the present application, because the housing 21 of the main partition-plate body 20 has the containing cavity, and both of the mounting plate 211 and the locking plate 212 of the housing 21 are plates that enclose to form the cavity wall of the containing cavity, the handle assembly 10 and the main partition-plate body 20 may be connected; in other words, the main handle body 11 of the handle assembly 10 may be mounted to the mounting plate 211. Because the main handle body 11 is connected to the locking assembly 12, the locking assembly 12 is located in the containing cavity, the avoiding hole 2121 is provided in the locking plate 212, and the position of the locking assembly 12 faces the position of the avoiding hole 2121, when the handle assembly 10 is in different states, the locking assembly 12 may protrude out of the avoiding hole 2121 or retract inside the avoiding hole 2121. Particularly, when the handle assembly 10 is in the first state, part of the locking assembly 12 protrudes out of the avoiding hole 2121, and protrudes out of the mounting plate 211. When the handle assembly 10 is in the second state, part of the locking assembly 12 retracts inside the avoiding hole 2121, and is flush with the mounting plate 211. In other words, in the embodiments of the present application, by providing the main handle body 11 and the locking assembly 12, and by providing the avoiding hole 2121 in the locking plate 212, part of the locking assembly 12 may protrude out of the avoiding hole 2121, or the locking assembly 12 may retract inside the avoiding hole 2121. Therefore, when the air-blower-container fan partition-plate according to the embodiments of the present application is applied in the air-blower-container module, and the air-blower-container module is installed in the server, the air-blower-container module may be locked in the server by using the locking assembly 12; in other words, by configuring that part of the locking assembly 12 protrudes out of the avoiding hole 2121, the part of the locking assembly 12 locks the air-blower-container module in the server. When it is required to detach the air-blower-container module, the locking assembly 12 may be caused to retract inside the avoiding hole 2121, thereby detaching the air-blower-container module from the server. In other words, by providing the main handle body 11 and the locking assembly 12, that may facilitate the user to hold the main handle body 11 so as to install the air-blower-container module into the server, and the locking assembly 12 may lock the air-blower-container module in the server, so as to facilitate the installation of the air-blower-container module in the server.

Furthermore, in some embodiments, the locking assembly 12 may comprise a locking housing 121 and a stretching assembly 122. The locking housing 121 is located in the containing cavity, the locking housing 121 is connected to the main handle body 11, part of the stretching assembly 122 is located in the locking housing 121, the position of the stretching assembly 122 faces the position of the avoiding hole 2121, and the stretching assembly 122 is stretchable. When the handle assembly 10 is in the first state, part of the stretching assembly 122 protrudes out of the avoiding hole 2121, and protrudes out of the mounting plate 211. When the handle assembly 10 is in the second state, part of the stretching assembly 122 retracts inside the avoiding hole 2121, and is flush with the mounting plate 211.

Because the locking housing 121 is located in the containing cavity, the locking housing 121 is connected to the main handle body 11, part of the stretching assembly 122 is located in the locking housing 121, the position of the stretching assembly 122 faces the position of the avoiding hole 2121, and the stretching assembly 122 is stretchable, when the stretching assembly 122 is stretching, the stretching assembly 122 enters the avoiding hole 2121, and subsequently protrudes out of the avoiding hole 2121 or retracts inside the avoiding hole 2121. Particularly, when the handle assembly 10 is in the first state, part of the stretching assembly 122 protrudes out of the avoiding hole 2121, and protrudes out of the mounting plate 211. When the handle assembly 10 is in the second state, part of the stretching assembly 122 retracts inside the avoiding hole 2121, and is flush with the mounting plate 211. In other words, by providing the locking housing 121 and the stretching assembly 122, that may facilitate the locking assembly 12 to lock the air-blower-container module.

It should be noted that, when the air-blower-container fan partition-plate is applied in the air-blower-container module, and the air-blower-container module is installed in the server, when the air-blower-container module is outside the server, the stretching assembly 122 is in an extending state, whereby part of the stretching assembly 122 protrudes out of the air-blower-container module. While the air-blower-container module is being installed into the server, the stretching assembly 122 that protrudes out of the air-blower-container module abuts the inner wall of the crate body 300 of the server, so that the stretching assembly 122 is in a contraction state, whereby the air-blower-container module may move relative to the crate body 300 of the server. After the air-blower-container module has been moved to the target position, the stretching assembly 122 faces the position of an installation slot on the crate body 300, whereby part of the stretching assembly 122 enters the installation slot, the stretching assembly 122 is in the extending state again, and the stretching assembly 122 abuts the slot wall of the installation slot, which may lock the position of the air-blower-container module.

Furthermore, in the embodiments of the present application, when the handle assembly 10 does not bear force, the handle assembly 10 is in the first state, and when the handle assembly 10 bears force, the handle assembly 10 is in the second state.

Furthermore, in some embodiments, the stretching assembly 122 may comprise an elastic member 1221 and a bolt 1222. The bolt 1222 comprises a fixing part 1223 and a locking part 1224, the fixing part 1223 is connected to the locking part 1224, the fixing part 1223 is located in the locking housing 121, the fixing part 1223 is connected to the locking housing 121, the locking part 1224 is located outside the locking housing 121, the elastic member 1221 is located in the locking housing 121, a first end of the elastic member 1221 abuts the fixing part 1223, and a second end of the elastic member 1221 abuts the locking housing 121.

Because the fixing part 1223 is connected to the locking part 1224, the fixing part 1223 is located in the locking housing 121, the fixing part 1223 is connected to the locking housing 121, the locking part 1224 is located outside the locking housing 121, the elastic member 1221 is located in the locking housing 121, the first end of the elastic member 1221 abuts the fixing part 1223, and the second end of the elastic member 1221 abuts the locking housing 121, when the locking part 1224 is not exerted a pressure, the locking part 1224, by the effect of the elastic member 1221, may protrude out of the avoiding hole 2121. When the locking part 1224 is exerted a pressure, the locking part 1224 compresses the elastic member 1221, whereby the locking part 1224 retracts inside the avoiding hole 2121. Therefore, when the air-blower-container fan partition-plate is applied in the air-blower-container module, and the air-blower-container module is installed in the server, the locking part 1224 abuts the crate body 300 of the server. Accordingly, the crate body 300 of the server applies force to the locking part 1224, and the locking part 1224 applies force to the elastic member 1221, whereby the elastic member 1221 is compressed, and the locking part 1224 retracts inside the avoiding hole 2121. After the air-blower-container module has been moved to the target position in the crate body 300 of the server, the locking part 1224 faces the position of the installation slot on the crate body 300, so that the locking part 1224, because of the effect of the elastic member 1221, enters the installation slot, whereby the locking part 1224 locks the air-blower-container module.

Furthermore, in the embodiments of the present application, when the locking part 1224 enters the installation slot on the crate body 300 of the server, the locking part 1224, by the effect of the elastic member 1221, quickly moves and knocks the slot bottom of the installation slot, to emit a sound, and the operator, when hears the sound, may determine that the air-blower-container module has been moved to the target position.

It should be noted that the fixing part 1223 and the locking housing 121 may be connected by a rivet. In other words, the locking housing 121 is provided with a riveting hole, the fixing part 1223 is also provided with a riveting hole, and by using a rivet that penetrates the riveting hole in the locking housing 121 and the riveting hole in the fixing part 1223, the fixing part 1223 and the locking housing 121 are connected. Certainly, the fixing part 1223 and the locking housing 121 may also be connected in other modes. For example, the fixing part 1223 and the locking housing 121 are connected by welding. That is not limited in the embodiments of the present application.

Furthermore, in some embodiments, the fixing part 1223 may comprise a fixing column 12231 and a boss 12232 provided on the fixing column 12231, the boss 12232 surrounds the outer wall of the fixing column 12231, and one end of the fixing column 12231 is connected to the locking part 1224.

Because the fixing part 1223 comprises the fixing column 12231 and the boss 12232 provided on the fixing column 12231, and the boss 12232 surrounds the outer wall of the fixing column 12231, in the process of the assembling of the air-blower-container fan partition-plate, the first end of the elastic member 1221 may abut the boss 12232, so that the elastic member 1221 does not disengage from the avoiding hole 2121. In other words, by providing the fixing column 12231, and providing the boss 12232 on the fixing column 12231, that may facilitate to mount the elastic member 1221.

Furthermore, in some embodiments, the elastic member 1221 may be a spring, the spring is nested to the fixing column 12231, and a first end of the spring abuts the surface of the boss 12232 that is opposite to the locking part 1224.

When the elastic member 1221 is a spring, the spring may be nested to the fixing column 12231, whereby the first end of the spring may abut the boss 12232, and the second end of the spring may abut the locking housing 121. When the fixing part 1223 and the locking housing 121 have been connected, the spring may be compressed by the boss 12232, or apply force to the boss 12232, whereby the locking part 1224 retracts inside the avoiding hole 2121 or the locking part 1224 protrudes out of the avoiding hole 2121. In other words, by configuring that the elastic member 1221 is a spring, that may facilitate to mount the elastic member 1221.

Certainly, in the embodiments of the present application, the elastic member 1221 may also be another device that has elasticity. For example, the elastic member 1221 is an elastic sheet, in which case one end of the elastic sheet may be caused to abut the boss 12232 on the fixing column 12231, and the other end of the elastic sheet may be caused to abut the locking housing 121. The particular type of the elastic member 1221 is not limited in the embodiments of the present application.

Furthermore, in some embodiments, the locking housing 121 may comprise an upper housing 1211 and a lower housing 1212. The upper housing 1211 abuts the lower housing 1212, the lower housing 1212 is connected to the main handle body 11, the upper housing 1211 is of a tubular structure, the inner wall of the upper housing 1211 has a blocking boss 12111, the lower housing 1212 has a containing space, the fixing part 1223 penetrates the upper housing 1211, and part of the fixing part 1223 is located in the containing space and connected to the lower housing 1212.

When the locking housing 121 comprises the upper housing 1211 and the lower housing 1212, the upper housing 1211 is of a tubular structure, the inner wall of the upper housing 1211 has the blocking boss 12111, and the lower housing 1212 has the containing space, while the locking assembly 12 is being installed, the process may comprise penetrating the fixing part 1223 of the bolt 1222 through the upper housing 1211, to cause part of the fixing part 1223 to be located in the lower housing 1212, and subsequently connecting the lower housing 1212 to the fixing part 1223 located in the lower housing 1212; and providing the elastic member 1221 in the upper housing 1211, wherein the first end of the elastic member 1221 abuts the fixing part 1223, and the second end of the elastic member 1221 abuts the blocking boss 12111 in the upper housing 1211. Furthermore, the lower housing 1212 is connected to the main handle body 11, and the fixing part 1223 penetrates the upper housing 1211 and is partially located in the lower housing 1212, which is equivalent to connecting the upper housing and the lower housing by using the fixing part 1223. Therefore, the main handle body 11 may be used to apply force to the lower housing 1212, whereby the lower housing 1212 drives the upper housing 1211 to move, and the upper housing 1211 drives the bolt 1222 to move. Therefore, when it is required to retract the bolt 1222 inside the mounting hole, the main handle body 11 may be used to drive the bolt 1222 to move, to cause the locking part 1224 to retract inside the mounting hole. In other words, by providing the upper housing 1211 and the lower housing 1212, that may facilitate to mount the locking assembly 12, and also facilitate to cause the locking part 1224 to retract inside the avoiding hole 2121 by using the main handle body 11.

It should be noted that, when the locking housing 121 comprises the upper housing 1211 and the lower housing 1212, the lower housing 1212 may be provided with a riveting hole, and the fixing part 1223 may also be provided with a riveting hole, so as to, by using a rivet that penetrates the riveting hole in the lower housing 1212 and the riveting hole in the fixing part 1223, connect the fixing part 1223 and the lower housing 1212. Certainly, the fixing part 1223 and the lower housing 1212 may also be welded, so as to connect the fixing part 1223 and the lower housing 1212. The mode of connecting the fixing part 1223 and the lower housing 1212 is not limited in the embodiments of the present application.

It should also be noted that, when the locking housing 121 comprises the upper housing 1211 and the lower housing 1212, the upper housing 1211 may be riveted to the mounting plate 211, so that the relative position between the upper housing 1211 and the mounting plate 211 is fixed, whereby the upper housing 1211 does not easily shake.

Furthermore, in some embodiments, the locking part 1224 may have an oblique face.

When the locking part 1224 has the oblique face, when the air-blower-container fan partition-plate is applied in the air-blower-container module, when the locking part 1224 protrudes out of the avoiding hole 2121, when it is required to install the air-blower-container module into the server, the air-blower-container module is placed in the crate body 300 of the server, and subsequently the air-blower-container module is applied force by holding the main handle body 11, whereby the air-blower-container module moves relative to the crate body 300 of the server. Therefore, the locking part 1224 is exerted the pressure of the crate body 300, and the locking part 1224 applies force to the elastic member 1221, to compress the elastic member 1221. When it is required to detach the air-blower-container module, the oblique face of the locking part 1224 contacts the slot wall of the installation slot of the crate body 300 of the server, which facilitates the locking part 1224 to disengage from the installation slot. In other words, by configuring that the locking part 1224 has the oblique face, that may facilitate the locking part 1224 to disengage from the installation slot on the crate body 300 of the server.

Furthermore, in some embodiments, a first mounting hole 2111 and a second mounting hole 2112 may be provided in the mounting plate 211, a first end of the main handle body 11 penetrates the first mounting hole 2111, and the locking housing 121 is connected to the first end of the main handle body 11. A second end of the main handle body 11 is connected to a fastening column 111, the fastening column 111 penetrates the second mounting hole 2112, and the fastening column 111 is fixed by a fastener 001.

Because the mounting plate 211 is provided with the first mounting hole 2111 and the second mounting hole 2112, while the main handle body 11 is being mounted, the first end of the main handle body 11 may penetrate the first mounting hole 2111, and the locking housing 121 may be located in the containing cavity of the housing 21, whereby the locking housing 121 may be connected to the first end of the main handle body 11. In addition, the second end of the main handle body 11 is connected to a fastening column 111, whereby, by penetrating the fastening column 111 through the second mounting hole 2112, subsequently fixing the fastening column 111 by using the fastener 001, and, by the main handle body 11, driving the second end to be fixed, the main handle body 11 may be connected to the mounting plate 211. In other words, by providing the first mounting hole 2111 and the second mounting hole 2112, that may facilitate to mount the main handle body 11.

It should be noted that the first end of the main handle body 11 and the hole wall of the first mounting hole 2111 have a gap therebetween, wherein the gap may be 0.1 millimeters, or 0.05 millimeters, or 0.15 millimeters, whereby the main handle body 11 may have a certain movement margin in the first mounting hole 2111. The fastening column 111 and the hole wall of the second mounting hole 2112 have a gap therebetween, wherein the gap may be 0.1 millimeters, or 0.05 millimeters, or 0.15 millimeters, whereby the fastening column 111 may have a certain movement margin in the second mounting hole 2112.

Furthermore, in some embodiments, both of the first mounting hole 2111 and the second mounting hole 2112 may be oblong holes, and the direction of extension of the oblong holes is the same as the direction of stretching of the stretching assembly 122.

Because both of the first mounting hole 2111 and the second mounting hole 2112 may be oblong holes, and the direction of extension of the oblong holes is the same as the direction of stretching of the stretching assembly 122, when the air-blower-container fan partition-plate is applied in the air-blower-container module, after the air-blower-container module has been installed in the crate body 300 of the server, the locking part 1224 is located in the installation slot on the crate body 300. While the air-blower-container module is being detached, the main handle body 11 may be applied force by holding the main handle body 11, so that the main handle body 11 moves in the direction of extension of the oblong holes. Moreover, as the direction of extension of the main handle body 11 is the same as the direction of stretching of the stretching assembly 122, the main handle body 11 may move in the direction of contraction of the stretching assembly 122, so that the main handle body 11 drives the locking housing 121 to move, whereby the locking housing 121 drives the stretching assembly 122 to move, to cause part of the stretching assembly 122 to retract inside the avoiding hole 2121. In other words, the stretching assembly 122 no longer locks the air-blower-container module, and therefore the air-blower-container module may be taken out of the crate body 300 of the server. In other words, by configuring that both of the first mounting hole 2111 and the second mounting hole 2112 may be oblong holes, and the direction of extension of the oblong holes is the same as the direction of stretching of the stretching assembly 122, that may facilitate to detach the air-blower-container module.

It should be noted that, when the stretching assembly 122 comprises the elastic member 1221, the direction of extension of the oblong holes is the same as the direction of stretching of the elastic member 1221, and when it is required to detach the air-blower-container module, the main handle body 11 may be held, whereby the main handle body 11 moves in the direction of compression of the elastic member 1221.

Furthermore, in some embodiments, the main handle body 11 may be provided with a first blocking part 112 and a second blocking part 113, the first blocking part 112 is located at the first end of the main handle body 11, the second blocking part 113 is located at the second end of the main handle body 11, both of the first blocking part 112 and the second blocking part 113 are located outside the containing cavity, the first blocking part 112 blocks the space of the first mounting hole 2111 that is not occupied by the first end of the main handle body 11, and the second blocking part 113 blocks the space of the second mounting hole 2112 that is not occupied by the fastening column 111.

When the main handle body 11 is provided with the first blocking part 112 and the second blocking part 113, the first blocking part 112 is located at the first end of the main handle body 11, the second blocking part 113 is located at the second end of the main handle body 11, and both of the first blocking part 112 and the second blocking part 113 are located outside the containing cavity, after the main handle body 11 has been mounted to the mounting plate 211, the first blocking part 112 may block the space of the first mounting hole 2111 that is not occupied by the first end of the main handle body 11, and the second blocking part 113 may block the space of the second mounting hole 2112 that is not occupied by the fastening column 111, which may prevent hot air from being leaked via the first mounting hole 2111 and the second mounting hole 2112. In other words, by providing the first blocking part 112 and the second blocking part 113, the problem of leaking of hot air via the first mounting hole 2111 and the second mounting hole 2112 may be prevented.

Furthermore, in some embodiments, in the direction of contraction of the stretching assembly 122, the distance between the first end of the main handle body 11 and the hole wall of the first mounting hole 2111 is equal to the distance between the fastening column 111 and the hole wall of the second mounting hole 2112, and the distance between the first end of the main handle body 11 and the hole wall of the first mounting hole 2111 is greater than or equal to the protrusion length by which the stretching assembly 122 protrudes out of the mounting plate 211, wherein the protrusion length refers to, when the stretching assembly 122 protrudes out of the mounting plate 211, the distance between one end of the stretching assembly 122 that protrudes out of the mounting plate 211 and the mounting plate 211.

Because, in the direction of contraction of the stretching assembly 122, the distance between the first end of the main handle body 11 and the hole wall of the first mounting hole 2111 is greater than or equal to the protrusion length by which the stretching assembly 122 protrudes out of the mounting plate 211, when the main handle body 11 is held to apply force to the locking housing 121 to cause the locking housing 121 to drive the stretching assembly 122 to contract, it can be ensured that the stretching assembly 122 completely retracts inside the avoiding hole 2121. Therefore, while the air-blower-container module is being detached, the problem may be prevented that part of the stretching assembly 122 is still located in the installation slot and the air-blower-container module is difficult to detach. Furthermore, the main handle body 11 is an entirety. In order to ensure that, when the two ends of the main handle body 11 are moving, the movement amounts are equal, it is configured that, in the direction of contraction of the stretching assembly 122, the distance between the first end of the main handle body 11 and the hole wall of the first mounting hole 2111 is equal to the distance between the fastening column 111 and the hole wall of the second mounting hole 2112, which may ensure that, when the main handle body 11 is held to cause the main handle body 11 to drive the locking housing 121 to move, so as to cause the stretching assembly 122 to move in the direction of contraction, both of the two ends of the main handle body 11 have sufficient movement amounts, so as to prevent the problem that the main handle body 11 is blocked by the first mounting hole 2111 or the second mounting hole 2112 and therefore the stretching assembly 122 cannot retract inside the avoiding hole 2121.

Furthermore, in some embodiments, the length of the fastening column 111 may be greater than the thickness of the mounting plate 211, wherein the length of the fastening column 111 refers to the distance between the two opposite ends of the fastening column 111.

Because the length of the fastening column 111 may be greater than the thickness of the mounting plate 211, when the operator is holding the main handle body 11, the operator applies force to the main handle body 11, and the main handle body 11 may have a certain movement margin in the axial direction of the fastening column 111, whereby the main handle body 11 may move in the direction of extension of the oblong holes. That facilitates to drive the locking housing 121 to move by using the main handle body 11, so that the locking housing 121 drives the stretching assembly 122 to retract inside the avoiding hole 2121, which facilitates to detach the air-blower-container module.

Furthermore, in some embodiments, the difference between the length of the fastening column 111 and the thickness of the mounting plate 211 is within a preset difference range, wherein the preset difference range is 1.5 millimeters to 2.5 millimeters. Therefore, while the main handle body 11 is being held, the main handle body 11 may have a certain movement margin in the axial direction of the fastening column 111, and the movement margin of the main handle body 11 is suitable. That does not only facilitate to drive the locking housing 121 to move by using the main handle body 11, to cause the locking housing 121 to drive the stretching assembly 122 to retract inside the avoiding hole 2121, which facilitates to detach the air-blower-container module, but also prevents an excessively large movement margin of the main handle body 11, which results in the problem of easy loosening of the main handle body 11.

It should be noted that the difference between the length of the fastening column 111 and the thickness of the mounting plate 211 may be any one numerical value in the range of 1.5 millimeters to 2.5 millimeters. For example, the difference between the length of the fastening column 111 and the thickness of the mounting plate 211 may be 1.5 millimeters, may also be 1.8 millimeters, may also be 2 millimeters, may also be 2.3 millimeters, and may also be 2.5 millimeters.

Furthermore, in some embodiments, a threaded hole may be provided in the fastening column 111 in the axial direction of the fastening column 111, the fastener 001 is a screw, the screw is provided in the threaded hole, and a nut of the screw and the second end of the main handle body 11 are located on the two sides of the mounting plate 211.

Because the fastening column 111 is provided with the threaded hole in the axial direction of the fastening column 111, and the fastener 001 is a screw, after the fastening column 111 has penetrated the second mounting hole 2112, the screw may be provided in the threaded hole, thereby fixing the fastening column 111 by using the screw. When the screw is provided in the threaded hole, the nut of the screw is caused to be located on one side of the mounting plate 211, and the main handle body 11 is caused to be located on the other side of the mounting plate 211, whereby the fastening column 111 is fixed by the effect of the screw.

Furthermore, in an embodiment of the present application, a first through hole may be provided in the locking housing 121, a second through hole is provided in the main handle body 11, and a riveting pin 002 penetrates the first through hole and the second through hole, to cause the locking housing 121 to be connected to the main handle body 11.

Certainly, in the embodiments of the present application, the locking housing 121 and the main handle body 11 may also be connected in other modes. For example, the locking housing 121 and the main handle body 11 are welded. As another example, the locking housing 121 and the main handle body 11 are connected by a screw. That is not limited in the embodiments of the present application.

Furthermore, in some embodiments, amounting through hole may be provided in the housing 21, and the position of the mounting through hole faces the position of the first through hole.

When the mounting through hole is provided in the housing 21, the process of the assembling of the air-blower-container fan partition-plate may comprise firstly assembling the locking assembly 12, subsequently penetrating the first end of the main handle body 11 through the first mounting hole 2111, subsequently penetrating the riveting pin 002 through the mounting through hole, and penetrating the riveting pin 002 through the first through hole and the second through hole, to connect the locking housing 121 and the main handle body 11. In other words, by providing the mounting through hole, that may facilitate to connect the locking housing 121 and the main handle body 11.

Furthermore, in some embodiments, the air-blower-container fan partition-plate may further comprise a blocking member 30, the blocking member 30 is located in the mounting through hole, the blocking member 30 blocks the mounting through hole, and the blocking member 30 is flush with the housing 21.

When the blocking member 30 is located in the mounting through hole, the blocking member 30 blocks the mounting through hole, so as to prevent the problem that, after the air-blower-container fan partition-plate has been applied in the air-blower-container module and the fan modules 200 have been mounted in the air-blower-container module, hot air is leaked via the mounting through hole. In other words, by providing the blocking member 30, leakage of hot air via the mounting through hole may be prevented.

It should be noted that the material of the blocking member 30 may be a metal. Certainly, the material of the blocking member 30 may also be another material. For example, the material of the blocking member 30 is a rubber. That is not limited in the embodiments of the present application.

Furthermore, in some embodiments, the housing 21 may comprise a spring moving plate 213 and a plurality of connecting plates 214, the plurality of connecting plates 214, the mounting plate 211, the locking plate 212 and the spring moving plate 213 enclose to form the containing cavity, the spring moving plate 213 is movably connected to one of the connecting plates 214, the spring moving plate 213 is movable relative to the connecting plate 214, and the spring moving plate 213 is switchable between a deployment state and a contraction state. In this case, when the air-blower-container fan partition-plate is applied in the air-blower-container module, if the fan modules 200 are not provided in the air-blower container, the spring moving plate 213 may be deployed, i.e., causing the spring moving plate 213 to be in the deployment state, so that the spring moving plate 213 may serve to block hot air. When it is required to mount the fan modules 200, the spring moving plate 213 is caused to contract, i.e., causing the spring moving plate 213 to be in the contraction state, so that the spring moving plate 213 vacates an avoiding room for the fan modules 200, whereby the fan modules 200 may be mounted.

In the embodiments of the present application, because the housing 21 of the main partition-plate body 20 has the containing cavity, and both of the mounting plate 211 and the locking plate 212 of the housing 21 are plates that enclose to form the cavity wall of the containing cavity, the handle assembly 10 and the main partition-plate body 20 may be connected; in other words, the main handle body 11 of the handle assembly 10 may be mounted to the mounting plate 211. Because the main handle body 11 is connected to the locking assembly 12, the locking assembly 12 is located in the containing cavity, the avoiding hole 2121 is provided in the locking plate 212, and the position of the locking assembly 12 faces the position of the avoiding hole 2121, when the handle assembly 10 is in different states, the locking assembly 12 may protrude out of the avoiding hole 2121 or retract inside the avoiding hole 2121. Particularly, when the handle assembly 10 is in the first state, part of the locking assembly 12 protrudes out of the avoiding hole 2121, and protrudes out of the mounting plate 211. When the handle assembly 10 is in the second state, part of the locking assembly 12 retracts inside the avoiding hole 2121, and is flush with the mounting plate 211. In other words, in the embodiments of the present application, by providing the main handle body 11 and the locking assembly 12, and by providing the avoiding hole 2121 in the locking plate 212, part of the locking assembly 12 may protrude out of the avoiding hole 2121, or the locking assembly 12 may retract inside the avoiding hole 2121. Therefore, when the air-blower-container fan partition-plate according to the embodiments of the present application is applied in the air-blower-container module, and the air-blower-container module is installed in the server, the air-blower-container module may be locked in the server by using the locking assembly 12; in other words, by configuring that part of the locking assembly 12 protrudes out of the avoiding hole 2121, the part of the locking assembly 12 locks the air-blower-container module in the server. When it is required to detach the air-blower-container module, the locking assembly 12 may be caused to retract inside the avoiding hole 2121, thereby detaching the air-blower-container module from the server. In other words, by providing the main handle body 11 and the locking assembly 12, that may facilitate the user to hold the main handle body 11 so as to install the air-blower-container module into the server, and the locking assembly 12 may lock the air-blower-container module in the server, so as to facilitate the installation of the air-blower-container module in the server.

Figure 8:
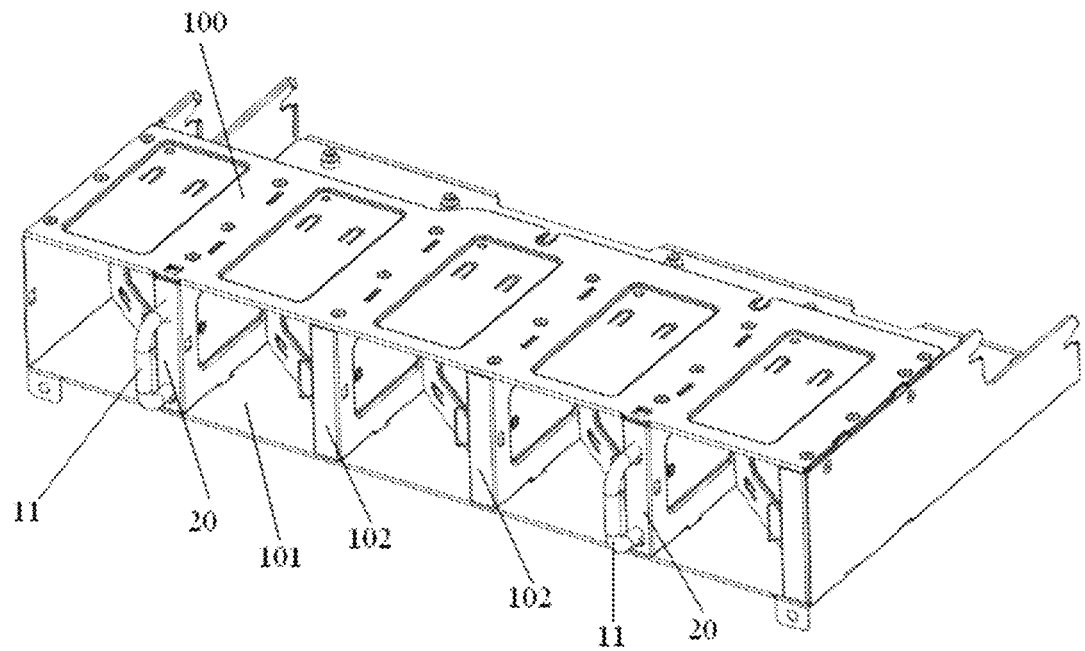
FIG. 8 shows a first schematic diagram of an air-blower-container module according to an embodiment of the present application.
Figure 9:
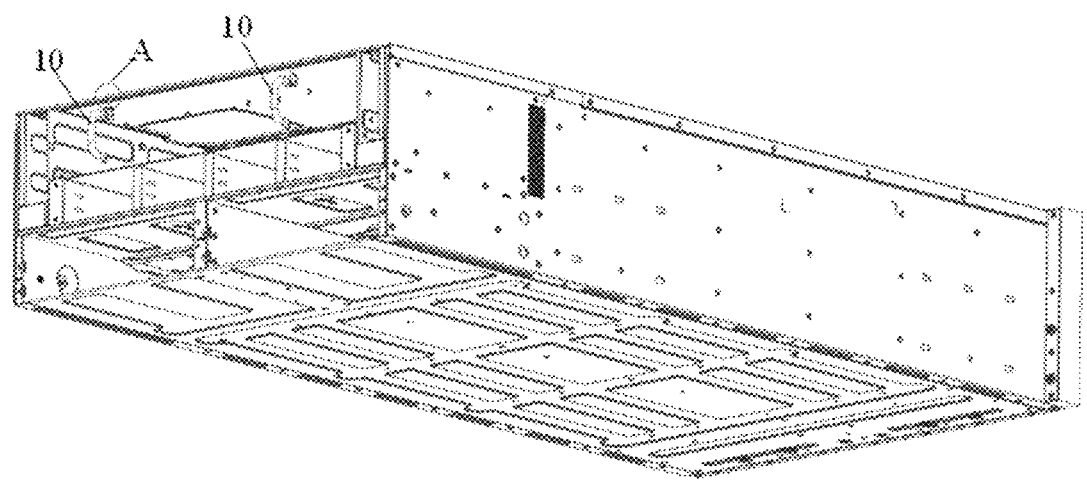
FIG. 9 shows a second schematic diagram of an air-blower-container module according to an embodiment of the present application.
Figure 10:
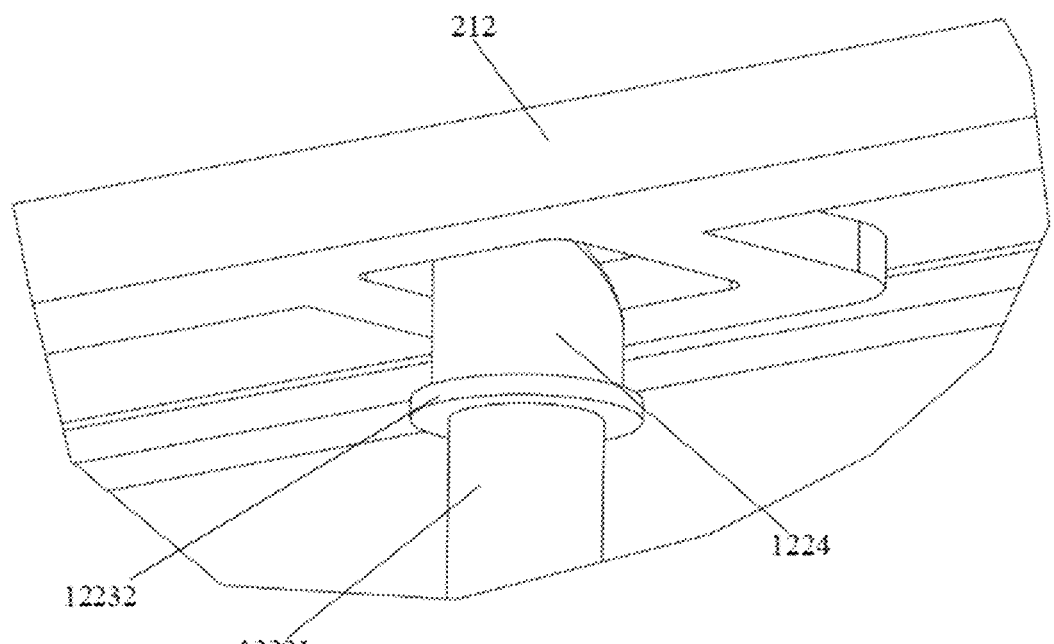
FIG. 10 shows an enlarged view of the position A in FIG. 9.

An embodiment of the present application provides an air-blower-container module. As shown in FIGS. 8, 9 and 10, the air-blower-container module comprises a container body 100 and the air-blower-container fan partition-plate according to any one of the above embodiments. The container body 100 has an installation cavity 101, the air-blower-container fan partition-plate is installed in the installation cavity 101, the cavity wall of the installation cavity 101 has a locking hole, and the position of the locking hole faces the position of the avoiding hole 2121. When the handle assembly 10 is in the first state, part of the locking assembly 12 protrudes out of the locking hole, and protrudes out of the outer surface of the container body 100. When the handle assembly 10 is in the second state, part of the locking assembly 12 retracts inside the locking hole, and is flush with the mounting plate 211.

In the embodiments of the present application, because the housing 21 of the main partition-plate body 20 has the containing cavity, and both of the mounting plate 211 and the locking plate 212 of the housing 21 are plates that enclose to form the cavity wall of the containing cavity, the handle assembly 10 and the main partition-plate body 20 may be connected; in other words, the main handle body 11 of the handle assembly 10 may be mounted to the mounting plate 211. Because the main handle body 11 is connected to the locking assembly 12, the locking assembly 12 is located in the containing cavity, the avoiding hole 2121 is provided in the locking plate 212, the position of the locking assembly 12 faces the position of the avoiding hole 2121, and the position of the locking hole faces the position of the avoiding hole 2121, when the handle assembly 10 is in different states, the locking assembly 12 may protrude out of the avoiding hole 2121 or retract inside the avoiding hole 2121, thereby protruding out of the locking hole or retracting inside the avoiding hole 2121. Particularly, when the handle assembly 10 is in the first state, part of the locking assembly 12 protrudes out of the locking hole, and protrudes out of the outer surface of the container body 100. When the handle assembly 10 is in the second state, part of the locking assembly 12 retracts inside the locking hole, and is flush with the mounting plate 211. In other words, in the embodiments of the present application, by providing the main handle body 11 and the locking assembly 12, and by providing the avoiding hole 2121 in the locking plate 212, and providing the locking hole in the container body 100, part of the locking assembly 12 may protrude out of the avoiding hole 2121, or the locking assembly 12 may retract inside the avoiding hole 2121, thereby protruding out of the locking hole or retracting inside the locking hole. Therefore, when the air-blower-container fan partition-plate according to the embodiments of the present application is applied in the air-blower-container module, and the air-blower-container module is installed in the server, the air-blower-container module may be locked in the server by using the locking assembly 12; in other words, by configuring that part of the locking assembly 12 protrudes out of the locking hole, the part of the locking assembly 12 locks the air-blower-container module in the server. When it is required to detach the air-blower-container module, the locking assembly 12 may be caused to retract inside the locking hole, thereby detaching the air-blower-container module from the server. In other words, by providing the main handle body 11 and the locking assembly 12, that may facilitate the user to hold the main handle body 11 so as to install the air-blower-container module into the server, and the locking assembly 12 may lock the air-blower-container module in the server, so as to facilitate the installation of the air-blower-container module in the server.

Furthermore, in some embodiments, the quantity of the air-blower-container fan partition-plate is two, and the air-blower-container module further comprises a plurality of blocking plates 102. The two air-blower-container fan partition-plates are separately arranged, all of the plurality of blocking plates 102 are separately arranged between the two air-blower-container fan partition-plates, the gaps between the air-blower-container fan partition-plates and the blocking plates 102 are for containing the fan modules 200, the gaps between the air-blower-container fan partition-plates and the inner walls of the container body 100 are for containing the fan modules 200, and the gaps between the blocking plates 102 are for containing the fan modules 200.

Because the quantity of the air-blower-container fan partition-plate 102 is two, while the air-blower-container module is being installed into the server, the operator may hold the two main handle bodies 11 with the two hands, which facilitates the operator to install the air-blower-container module. Because the two air-blower-container fan partition-plates are separately arranged, and all of the plurality of blocking plates 102 are separately arranged between the two air-blower-container fan partition-plates, the fan modules 200 may be provided in those gaps, whereby the air-blower-container module has the function of heat dissipation.

Furthermore, in some embodiments, the air-blower-container module may further comprise the fan modules 200. The fan modules 200 are provided in the gaps between the air-blower-container fan partition-plates and the blocking plates 102, and/or the gaps between the air-blower-container fan partition-plates and the inner walls of the container body 100, and/or the gaps between the blocking plates 102. When the fan modules 200 are provided in the air-blower-container module, when the air-blower-container module is applied in the server, the fan modules 200 may perform heat dissipation. In other words, by providing the fan modules 200, that may facilitate the heat dissipation to the server by the air-blower-container module.

Figure 11:
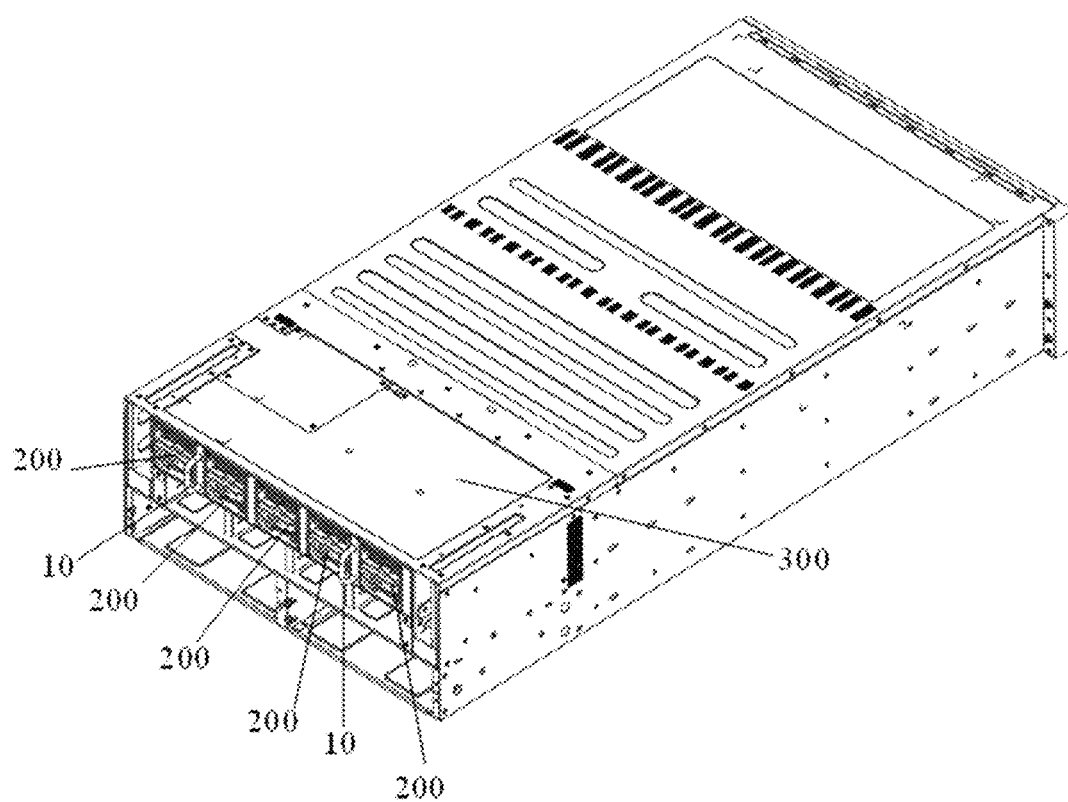
FIG. 11 shows a first schematic diagram of a server according to an embodiment of the present application.
Figure 12:
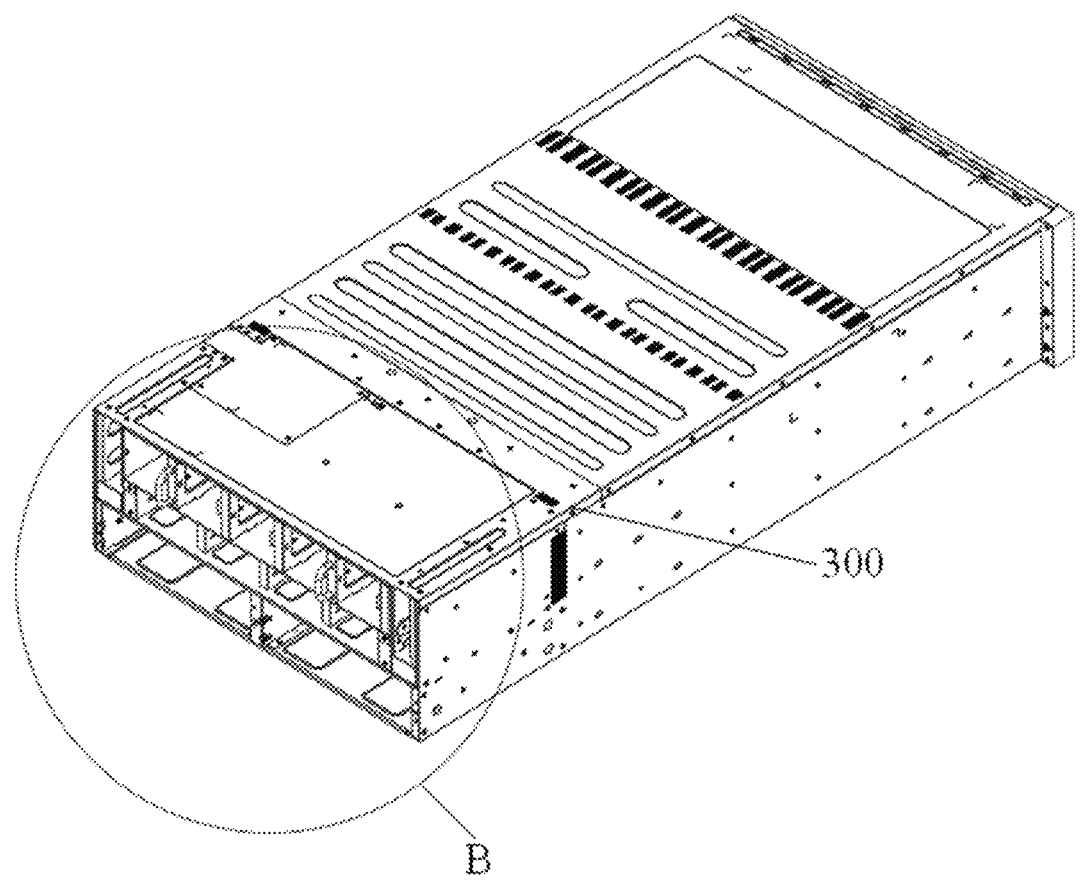
FIG. 12 shows a second schematic diagram of a server according to an embodiment of the present application.
Figure 13:
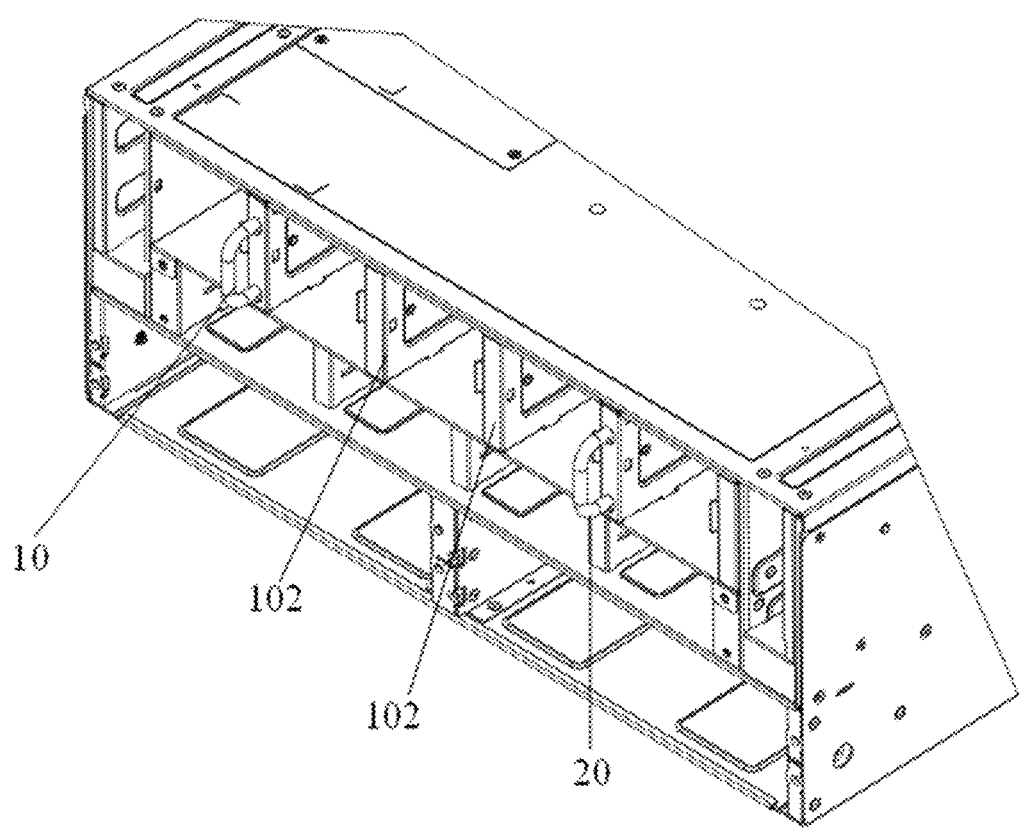
FIG. 13 shows an enlarged view of the position B in FIG. 12.

An embodiment of the present application provides a server. As shown in FIGS. 11, 12 and 13, the server comprises a crate body 300 and the air-blower-container module according to any one of the above embodiments. The installation slot is provided on the crate wall of the crate body 300, the air-blower-container module is installed in the crate body 300, and the locking assembly 12 that protrudes out of the outer surface of the container body 100 is located in the installation slot.

In the embodiments of the present application, because the housing 21 of the main partition-plate body 20 has the containing cavity, and both of the mounting plate 211 and the locking plate 212 of the housing 21 are plates that enclose to form the cavity wall of the containing cavity, the handle assembly 10 and the main partition-plate body 20 may be connected; in other words, the main handle body 11 of the handle assembly 10 may be mounted to the mounting plate 211. Because the main handle body 11 is connected to the locking assembly 12, the locking assembly 12 is located in the containing cavity, the avoiding hole 2121 is provided in the locking plate 212, the position of the locking assembly 12 faces the position of the avoiding hole 2121, and the position of the locking hole faces the position of the avoiding hole 2121, when the handle assembly 10 is in different states, the locking assembly 12 may protrude out of the avoiding hole 2121 or retract inside the avoiding hole 2121, thereby protruding out of the locking hole or retracting inside the avoiding hole 2121. Particularly, when the handle assembly 10 is in the first state, part of the locking assembly 12 protrudes out of the locking hole, and protrudes out of the outer surface of the container body 100. When the handle assembly 10 is in the second state, part of the locking assembly 12 retracts inside the locking hole, and is flush with the mounting plate 211. In other words, in the embodiments of the present application, by providing the main handle body 11 and the locking assembly 12, and by providing the avoiding hole 2121 in the locking plate 212, and providing the locking hole in the container body 100, part of the locking assembly 12 may protrude out of the avoiding hole 2121, or the locking assembly 12 may retract inside the avoiding hole 2121, thereby protruding out of the locking hole or retracting inside the locking hole. Therefore, when the air-blower-container fan partition-plate according to the embodiments of the present application is applied in the air-blower-container module, and the air-blower-container module is installed in the server, the air-blower-container module may be locked in the server by using the locking assembly 12; in other words, by configuring that part of the locking assembly 12 protrudes out of the locking hole, the part of the locking assembly 12 locks the air-blower-container module in the server. When it is required to detach the air-blower-container module, the locking assembly 12 may be caused to retract inside the locking hole, thereby detaching the air-blower-container module from the server. In other words, by providing the main handle body 11 and the locking assembly 12, that may facilitate the user to hold the main handle body 11 so as to install the air-blower-container module into the server, and the locking assembly 12 may lock the air-blower-container module in the server, so as to facilitate the installation of the air-blower-container module in the server.

It should be noted that, in the embodiments of the present application, when the locking assembly 12 comprises the bolt 1222, and the bolt 1222 comprises the locking part 1224, while the air-blower-container module is being installed into the server, once the locking part 1224 has been moved to the installation slot, the locking part 1224 knocks the slot bottom of the installation slot, to emit a sound, whereby the operator knows that the air-blower-container module has been installed in place.

It should be noted that the embodiments of the description are described in the mode of progression, each of the embodiments emphatically describes the differences from the other embodiments, and the same or similar parts of the embodiments may refer to each other.

Although some embodiments of the present application have been described, once a person skilled in the art has known the essential inventive concept, he may make further variations and modifications on those embodiments. Therefore, the appended claims are intended to be interpreted as including the some embodiments and all of the variations and modifications that fall within the scope of the embodiments of the present application.

Finally, it should also be noted that, herein, relation terms such as first and second are merely intended to distinguish one entity from another entity, and that does not necessarily require or imply that those entities have therebetween any such actual relation or order. Furthermore, the terms "include", "comprise" or any variants thereof are intended to cover non-exclusive inclusions, so that articles or terminal devices that include a series of elements do not only include those elements, but also include other elements that are not explicitly listed, or include the elements that are inherent to such articles or terminal devices. Unless further limitation is set forth, an element defined by the wording "comprising a . . . " does not exclude additional same element in the article or terminal device comprising the element.

The technical solutions of the present application have been described in detail above. The principle and the embodiments of the present application are described herein with reference to the particular examples. Moreover, for a person skilled in the art, according to the principle and the implementations of the present application, the particular embodiments and the range of application may be varied. In conclusion, the contents of the description should not be understood as limiting the present application.

The invention claimed is:

1. An air-blower-container fan partition-plate, wherein the air-blower-container fan partition-plate comprises a handle assembly and a main partition-plate body;
   the main partition-plate body comprises a housing, the housing has a containing cavity, the housing comprises a mounting plate and a locking plate, and both of the mounting plate and the locking plate are plates that enclose to form a cavity wall of the containing cavity;
   the handle assembly comprises a main handle body and a locking assembly, the main handle body is connected to the locking assembly, the locking assembly is located in the containing cavity, an avoiding hole is provided in the locking plate, a position of the locking assembly faces a position of the avoiding hole, and the main handle body is mounted to the mounting plate;
   in respond to the handle assembly being in a first state, part of the locking assembly protrudes out of the avoiding hole, and protrudes out of the locking plate;
   in respond to the handle assembly being in a second state, part of the locking assembly retracts inside the avoiding hole, and is flush with the locking plate;
   the locking assembly comprises a locking housing and a stretching assembly;
   the locking housing is located in the containing cavity, the locking housing is connected to the main handle body, part of the stretching assembly is located in the locking housing, a position of the stretching assembly faces the position of the avoiding hole, and the stretching assembly is stretchable;
   in respond to the handle assembly being in the first state, part of the stretching assembly protrudes out of the avoiding hole, and protrudes out of the locking plate; and
   in respond to the handle assembly being in the second state, part of the stretching assembly retracts inside the avoiding hole, and is flush with the locking plate.

2. The air-blower-container fan partition-plate according to claim 1, wherein the stretching assembly comprises an elastic member and a bolt; and
   the bolt comprises a fixing part and a locking part, the fixing part is connected to the locking part, the fixing part is located in the locking housing, the fixing part is connected to the locking housing, the locking part is located outside the locking housing, the elastic member is located in the locking housing, a first end of the elastic member abuts the fixing part, and a second end of the elastic member abuts the locking housing.

3. The air-blower-container fan partition-plate according to claim 2, wherein the fixing part comprises a fixing column and a boss provided on the fixing column, the boss surrounds an outer wall of the fixing column, and one end of the fixing column is connected to the locking part.

4. The air-blower-container fan partition-plate according to claim 3, wherein the elastic member is a spring, the spring is nested to the fixing column, and a first end of the spring abuts a surface of the boss that is opposite to the locking part.

5. The air-blower-container fan partition-plate according to claim 2, wherein the locking housing comprises an upper housing and a lower housing; and
   the upper housing abuts the lower housing, the lower housing is connected to the main handle body, the upper housing is of a tubular structure, an inner wall of the upper housing has a blocking boss, the lower housing has a containing space, the fixing part penetrates the upper housing, and part of the fixing part is located in the containing space and connected to the lower housing.

6. The air-blower-container fan partition-plate according to claim 2, wherein the locking part has an oblique face.

7. The air-blower-container fan partition-plate according to claim 1, wherein a first mounting hole and a second mounting hole are provided in the mounting plate, a first end of the main handle body penetrates the first mounting hole, and the locking housing is connected to the first end of the main handle body; and
   a second end of the main handle body is connected to a fastening column, the fastening column penetrates the second mounting hole, and the fastening column is fixed by a fastener.

8. The air-blower-container fan partition-plate according to claim 7, wherein both of the first mounting hole and the second mounting hole are oblong holes, and a direction of extension of the oblong holes is the same as a direction of stretching of the stretching assembly.

9. The air-blower-container fan partition-plate according to claim 8, wherein the main handle body is provided with a first blocking part and a second blocking part, the first blocking part is located at the first end of the main handle body, the second blocking part is located at the second end of the main handle body, both of the first blocking part and the second blocking part are located outside the containing cavity, the first blocking part blocks a space of the first mounting hole that is not occupied by the first end of the main handle body, and the second blocking part blocks a space of the second mounting hole that is not occupied by the fastening column.

10. The air-blower-container fan partition-plate according to claim 9, wherein in a direction of contraction of the stretching assembly, a distance between the first end of the main handle body and a hole wall of the first mounting hole is equal to a distance between the fastening column and a hole wall of the second mounting hole, and the distance between the first end of the main handle body and the hole wall of the first mounting hole is greater than or equal to a protrusion length by which the stretching assembly protrudes out of the locking plate, wherein the protrusion length refers to, when the stretching assembly protrudes out of the locking plate, a distance between one end of the stretching assembly that protrudes out of the locking plate and the locking plate.

11. The air-blower-container fan partition-plate according to claim 7, wherein a length of the fastening column is greater than a thickness of the mounting plate, wherein the length of the fastening column refers to a distance between two opposite ends of the fastening column.

12. The air-blower-container fan partition-plate according to claim 11, wherein a difference between the length of the fastening column and the thickness of the mounting plate is within a preset difference range, wherein the preset difference range is 1.5 millimeters to 2.5 millimeters.

13. The air-blower-container fan partition-plate according to claim 7, wherein a threaded hole is provided in the fastening column in an axial direction of the fastening column, the fastener is a screw, the screw is provided in the threaded hole, and a nut of the screw and the second end of the main handle body are located on two sides of the mounting plate.

14. The air-blower-container fan partition-plate according to claim 1, wherein a first through hole is provided in the locking housing, a second through hole is provided in the main handle body, and a riveting pin penetrates the first through hole and the second through hole, to cause the locking housing to be connected to the main handle body.

15. The air-blower-container fan partition-plate according to claim 14, wherein a mounting through hole is provided in the housing, and a position of the mounting through hole faces a position of the first through hole.

16. The air-blower-container fan partition-plate according to claim 15, wherein the air-blower-container fan partition-plate further comprises a blocking member, the blocking member is located in the mounting through hole, the blocking member blocks the mounting through hole, and the blocking member is flush with the housing.

17. The air-blower-container fan partition-plate according to claim 1, wherein the housing comprises a spring moving plate and a plurality of connecting plates, the plurality of connecting plates, the mounting plate, the locking plate and the spring moving plate enclose to form the containing cavity, the spring moving plate is movably connected to one instance of the connecting plates, the spring moving plate is movable relative to the connecting plate, and the spring moving plate is switchable between a deployment state and a contraction state.

18. An air-blower-container module, wherein the air-blower-container module comprises a container body and the air-blower-container fan partition-plate according to claim 1;
   the container body has an installation cavity, the air-blower-container fan partition-plate is installed in the installation cavity, a cavity wall of the installation cavity has a locking hole, and a position of the locking hole faces the position of the avoiding hole;
   in respond to the handle assembly being in the first state, part of the locking assembly protrudes out of the locking hole, and protrudes out of an outer surface of the container body; and
   in respond to the handle assembly being in the second state, part of the locking assembly retracts inside the locking hole, and is flush with the locking plate.

19. The air-blower-container module according to claim 18, wherein a quantity of the air-blower-container fan partition-plate is two, and the air-blower-container module further comprises a plurality of blocking plates; and
   the two air-blower-container fan partition-plates are separately arranged, all of the plurality of blocking plates are separately arranged between the two air-blower-container fan partition-plates, gaps between the air-blower-container fan partition-plates and the blocking plates are for containing fan modules, gaps between the air-blower-container fan partition-plates and inner walls of the container body are for containing fan modules, and gaps between the blocking plates are for containing fan modules.

20. A server, wherein the server comprises a crate body and the air-blower-container module according to claim 18; and
   an installation slot is provided on a crate wall of the crate body, the air-blower-container module is installed in the crate body, and the locking assembly that protrudes out of the outer surface of the container body is located in the installation slot.

* * * * *